United States Patent [19]

Missale

[11] 4,045,741
[45] Aug. 30, 1977

[54] SCANNING RECEIVER FOR USE IN A TOUR GUIDE SYSTEM

[76] Inventor: John V. Missale, 48-16 47th St., New York, N.Y. 11377

[21] Appl. No.: 509,564

[22] Filed: Sept. 26, 1974

[51] Int. Cl.² .............................................. H04B 1/32
[52] U.S. Cl. .................................................. 325/470
[58] Field of Search ................. 325/469, 470, 62, 399, 325/408, 414, 56, 63; 179/15 AV; 307/223, 251; 343/205, 206

[56] References Cited

U.S. PATENT DOCUMENTS

| 2,845,599 | 7/1958 | Di Toro et al. | 332/38 |
| 3,497,813 | 2/1970 | Gallagher | 325/456 |
| 3,617,895 | 11/1971 | Tomsa | 325/469 |
| 3,803,495 | 4/1974 | Reynolds | 325/470 |

OTHER PUBLICATIONS

Pulse, Digital & Switching Waveforms - Millman & Taub, pp. 693–695.
"Electronic Switch Using F.E.T." - P. Y. Begasse - IBM Technical Disclosure Bulletin - vol. 13, No. 6 - Nov., 1970, p. 1609.

Primary Examiner—Robert L. Griffin
Assistant Examiner—Marc E. Bookbinder
Attorney, Agent, or Firm—Behr & Woodbridge

[57] ABSTRACT

A tour guide system includes a radio receiver section adapted to receive a plurality of preselected signal frequencies and an automatic frequency selecting means for tuning the receiver only to one of the preselected frequencies whose signal strength exceeds a predetermined amplitude. The receiver section essentially comprises an antenna stage, a tuning stage, a signal amplitude detecting stage, an expander stage, and an audio transducer stage. The automatic frequency selecting means comprises a level detector having an input connected to the output of the receiver detector stage, an astable multivibrator having an input connected to the output of the level detector, a shift register having an input connected to the output of the astable multivibrator and having a plurality of output of each stages, each connected to a field effect transistor (FET) in the tuning stage of the receiver. The tuning stage of the receiver comprises a plurality of capacitors and FET's in parallel with a common inductance. In operation, the astable multivibrator causes the shift register to activate the FET's in such a fashion that the receiver searches for a frequency having a signal strength exceeding a predetermined value. When a frequency is found, the level detector causes the astable multivibrator to cease oscillating, thereby locking the receiver to the predetermined frequency as long as the amplitude of that frequency exceeds the certain predetermined value.

9 Claims, 1 Drawing Figure

SCANNING RECEIVER FOR USE IN A TOUR GUIDE SYSTEM

CROSS-REFERENCES TO RELATED APPLICATIONS

This application is related in subject matter to my copending application entitled: "A Tour Guide System Including Means for Noise and Cross Talk Suppression", Ser. No. 454,519, Filed Mar. 25, 1974 now U.S. Pat. No. 3,934,202. The descriptions and subject matter of said copending application are hereby incorporated by reference into this disclosure.

BACKGROUND OF THE INVENTION

1. Field of the Invention

This invention relates generally to a radio receiver which has the ability to select any one of a plurality of incoming frequencies whose amplitude is above a certain predetermined threshold level. In particular, the invention is directed to a tour guide system including an automatic frequency selecting means to help overcome the problem of background noise and cross-talk suppression.

2. Description of the Prior Art

A description of prior art tour guide systems may be found in my copending application entitled: "A Tour Guide System Including Means For Noise And Cross Talk Suppression", Ser. No. 454,519, Filed Mar. 25, 1974 now U.S. Pat. No. 3,934,202.

In a typical tour guide system, antenna loops are placed in the ground or floor of the tour area in a side-by-side relationship. The visitor on the tour carries with him a radio receiver which picks up the signal generated in that particular loop. As the visitor moves from loop to loop he receives a different program.

One of the difficulties with the use of a plurality of closed loops is that there is apt to be a great amount of cross-talk between loops. Therefore, a visitor listening to the message of one loop may, inadvertently, hear part of the message being delivered in one or more adjacent loops. In order to minimize the problem of cross-talk between loops in tour guide systems, several alternatives are possible. One technique is to use FM communications but, unfortunately, this leads to relatively complex and sophisticated circuitry which, in turn, produces higher costs. Such an approach is discussed in a patent to Abel, U.S. Pat. No. 3,474,451. Another technique, which was first employed by this inventor in the context of a tour guide system is to use a compressor in the transmitter and an expander in the receiver. While this technique does work well, it is still relatively expensive.

Another approach to minimizing cross-talk is to broadcast loop messages at different loop frequencies. This approach significantly reduces the problems of noise and cross-talk between loops, but then raises the necessity of having to change frequencies when going from loop to loop. If this is done manually it can be annoying and inconvenient to the tour guest. Therefore, a means was sought which would automatically select the correct frequency as the visitor goes from loop to loop. While automatic searching devices are known in the prior art, this is believed to be the first time that this technique has been used in the context of tour guide systems. More importantly, this is believed to be the first time that this particular automatic frequency selecting means has been used to select frequencies for a radio receiver or the like.

One advantage of the instant invention is that a superhetrodyne type radio receiver is not necessary since a simpler, linear receiver will do just as well at a much lower cost. In was in the context of the foregoing prior art that the following invention was perfected.

SUMMARY OF THE INVENTION

The radio receiver system of the present invention comprises two basic elements:

1. A linear radio receiver section and,

2. An automatic frequency selecting means which selects any signal of a predetermined frequency whose strength exceeds a certain threshold value.

The receiver section comprises essentially the following elements in series: an antenna; an adjustable tuning circuit made up of a plurality of capacitors in parallel with a common inductive element; a high input impedance FET; a high gain feed-back transistor amplifier; a half wave diode detector; a filter circuit; an amplifier stage; an expander stage including a variable gain amplifier and envelope detector; a buffer amplifier; an output amplifier and a loud speaker coupled with the output amplifier by a transformer.

The automatic frequency selecting means comprises: a level detector having an input coming from the output of the receiver filter circuit; an astable multivibrator controlled by the level detector; a shift register controlled by the astable multivibrator and a plurality of FET switch elements having an input connected to the output of the stages of the shift register.

The FET's are located in series with a plurality of capacitive elements. The capacitive elements and their respective FET's form one half of a plurality of tank circuits with a common inductive means. In this particular application the common inductive means is a pair of crossed ferrite core antennae. Additionally, the receiver section includes a gravity operated switch which controls the flow of power to the receiver and an optional multiposition switch which may be used to manually select the preselected frequencies. The automatic frequency selecting means also includes a time delay element which inserts a first digit or bit into the shift register prior to its sequencing in response to the astable multivibrator.

In operation, an incoming signal is picked up by the antenna and selected by the receiver tuning mechanism. The signal is then passed to the amplifying, detecting and filtering stages to another amplifier before it is received in the expander section. In the expander section the signal is expanded so that higher amplitude level signals receive a greater gain than do lower level signals. The output is then amplified and reproduced on an audio loudspeaker. Whenever the signal produced at the filter section exceeds a certain level, the level detector causes the astable multivibrator clock to stop running. This, in turn, stops the searching mode of the shift register and locks the FET in the full "ON" position. This, in turn, causes the receiver the continue to receive a signal at that one frequency until such time that the signal strength of that signal falls below the threshold level of the level detector. In that case, the astable multivibrator again continues to oscillate and the shift register proceeds into a search mode until it finds another suitable signal of sufficient strength.

These and other features of the invention will be more readily understood with reference to the following drawing.

DETAILED DESCRIPTION OF THE INVENTION

Figure 1:
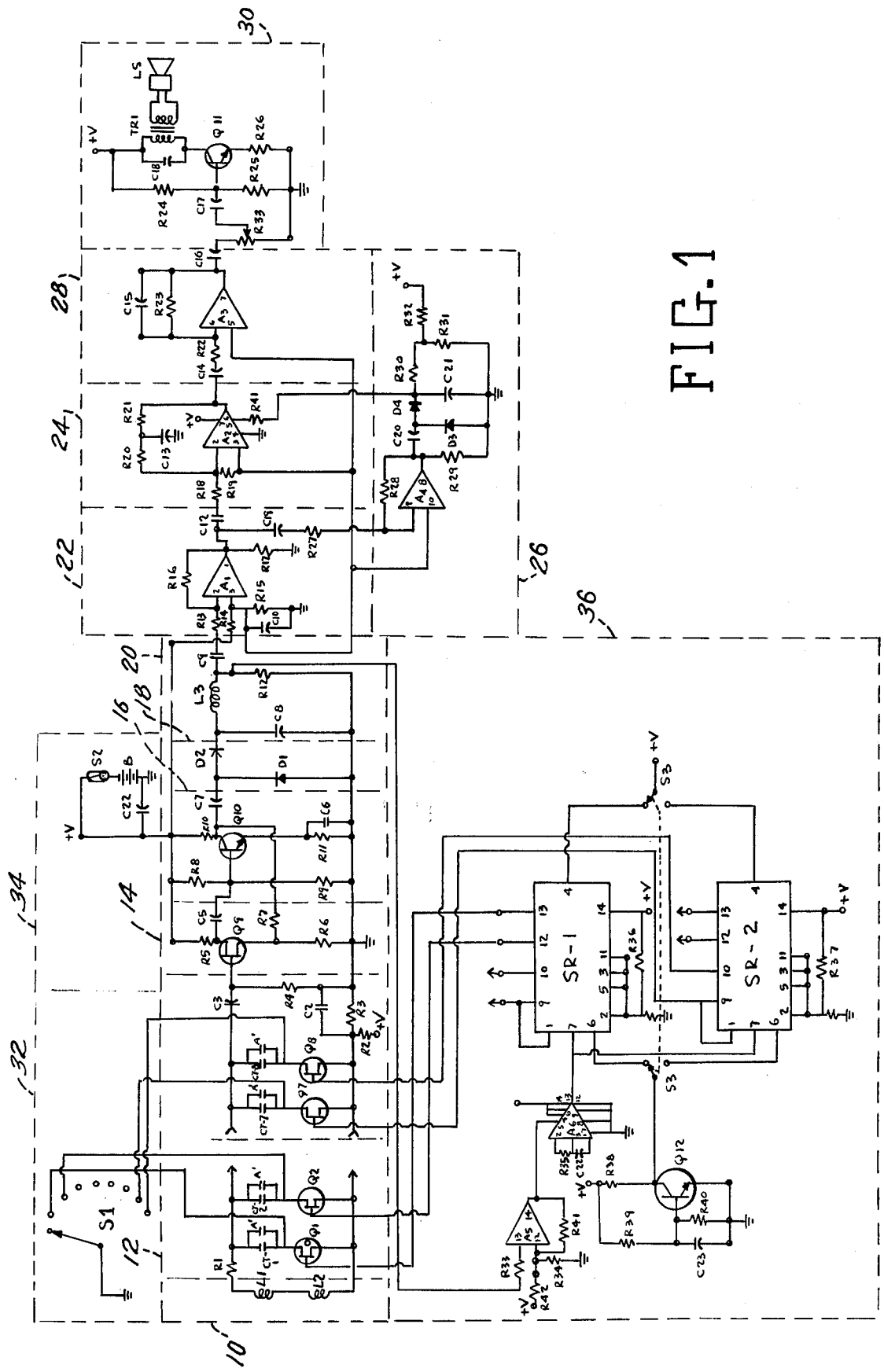
FIG. 1 is a schematic diagram of a preferred embodiment of the present invention.

The present invention is intended for use in the context of a tour guide system. The transmitting means may be either a plurality of individual transmitters each connected respectively to one or more transmitting loops, or it may be an individual transmitter which transmits on a plurality of preselected frequencies. Since transmitters of conventional design may be employed in this system, they will not be described in further detail. Additionally, the transmitter may include a compression means, such as that described in Applicant's copending application, Ser. No. 454,519 now U.S. Pat. No. 3,934,202. The use of a compressor in the transmitter is optional and several different types of conventional compressors may be used, even though the compressor described in Applicant's copending application would be preferred.

In a system of the type compatible with this receiver, a plurality of transmitting loops are placed in sequence along the path of the tour. Each loop transmits information at a preselected frequency (F). So therefore, if there are, for example, eight different loops, then there would be a plurality of preselected frequencies, F-1, F-2 ... F-8. Discrete frequencies were chosen so that cross-talk between loops would be effectively suppressed. The problem with such an arrangement is that as the tourist passes over the various loops, the frequency to which the receiver is tuned must be changed. The changing of the frequency can, of course, be done manually. However, this may be unsatisfactory because it is difficult for the tourist to discern which particular frequency is intended for that particular display. In order to overcome this problem, an automatic frequency selecting means was added to a tour guide receiver. The automatic frequency selecting means automatically selects the first frequency that exceeds a predetermined threshold signal strength. Since for each loop there is only one frequency which has the maximum strength, then it is seen that the frequency selecting means will automatically latch on to that one frequency which corresponds to the loop within which he is standing. The receiver of the present invention includes the following functional elements in series: an antenna section 10; a variable tuning section 12; a high input impedance isolating section 14; a high gain feed-back amplifier 16; a half wave diode rectifier section 18; a filtering section 20; an amplifier stage 22; an expander section comprising the variable gain amplifier 24; an envelope detector 26; buffer amplifier 28; and, audio amplifier and transducer 30.

The automatic frequency selecting means 36 derives its input from the output of filter section 20. The output of element 36 goes to input FET's Q-1 - Q-8 of tuner section 12. Switch 32 may be used as a manual override for automatic frequency selecting means 36. Associated with the entire circuit is a gravity actuated power supply 34. To better understand the structure and function of the present invention, the aforedescribed functional elements will be now examined in detail. During the course of this detailed examination, the operation of certain minor components will not be explained, since their function and purposes need no explanation.

When the receiver of the present invention is not in use it is stored upside-down, so that mercury switch S-2 disconnects battery B from the receiver. However, when the receiver is used, it is turned rightside-up and this causes the mercury in mercury switch S-2 to reestablish a circuit between battery B and the +V power supply point. The receiver chasis is so designed that a tourist can only use the receiver in the upright position and when the receiver is in the upright position, power is supplied to the active elements thereof.

For the sake of illustration, it will be presumed that the transmission system comprises eight, non-overlapping, closed loop antennae, each broadcasting on a preselected frequency F-1 - F-8 respectively. When the tourist enters the first loop, the antenna section will pick up frequency F-1 along with the other frequencies F-2 - F-8. The antenna section 10 comprises a pair of ferrite core antennae L-1 and L-2, each of which have a known inductance. L-1 and L-2 may be crossed in order to improve the omnidirectional property of the antenna. The signal received by L-1 and L-2 is passed through resistor R-1 to the adjustable tuning stage 12. Stage 12 comprises a plurality of capacative elements CT-1 - CT-8 each in series respectively with a field effect transistor FET Q-1 - Q-8. In parallel with capacitors CT-1 - CT-8 is a second capacitor A'. Capacitor A' may serve the function as a trimming capacitor to better improve the selectivity of the tuning stage. If the tourist is in Loop Zone 1, then FET Q-1 will shunt capacitor CT-1 and A' across inductances L-1 and L-2 in a manner that will be described in more detail later on. At the same time, FEt Q-2 - Q-8 will be turned off and, therefore, elements L-1, L-2, CT-1, A' and Q-1 form a resonant tank circuit with an input to isolation stage 14. FET's were chosen as the switching element in the tuning stage because of their characteristically low source/drain impedance. The lower the impedance in series with an L/C resonant tank circuit, the greater the Q factor and, therefore, the higher the selectivity and the greater the rejectivity of the tuning stage. On the other hand, if a transistor or other similar device were used, then the resistance of that element might reduce the Q of the resulting tank circuit and, therefore, allow other spurious frequencies to be received. The use of FET's in the context of this automatic frequency selecting means is believed to be novel. The frequency passed by the tank circuit comprising elements L-1, L-2, CT-1, A' and Q-1 flows through the coupling capacitor C-3 into the gate of isolating FET Q-9. Q-9 has a very high input impedance and a low output impedance and, therefore, it is not much of a drain upon the tuning stage 12. The output of isolation stage 14 is passed via coupling capacitor C-5 to the base of active transistor Q-10. Q-10 is the active element of a high gain amplifier section 16. In practice, stage 16 may have a gain of approximately 40 db. The gain of stage 16 is controlled by feedback resistor R-7 in a conventional manner. The signal passed by amplifier stage 16 is an AC signal, which is then rectified by diode voltage doubler and rectifier stage 18. The polarity of diodes D-1 and D-2 is such that the negative half cycle of the signal is shunted to ground through diode D-1 while the positive half cycle is passed via diode D-2 to filter stage 20. Filter stage 20 comprises capacitor C-8, resistor R-12 and inductor L-3. It filters and smoothes the output from the detector stage 18 in a manner similar to that employed with conventional power supplies and the like. The output from the filter stage 20 is split with one half of it passing through coupling capacitor C-9 to amplifier stage 22 and the other half of it passing through resistor R-33 to level detector amplifier A-5 of the automatic frequency selection means 36. According to the preferred embodiment, the level detector comprises a voltage comparator. The signal passed from stage 20 from coupling capacitor C-9 is conveyed through resistor R-13 to terminal 2 of amplifier A-1. Amplifier A-1 is part of amplifier stage 22. The signal received by stage 22 is amplified and passed into the expander section which comprises the variable gain amplifier stage 24 and the envelope detector stage 26. Again, the output is split through coupling capacitors C-12 and C-19 to the input terminals of amplifier of A-2 and A-4 via resistors R-18 and R-22 respectively. Amplifier A-2 is an operational transconductance amplifier whose gain may be varied according to the strength of the signal supplied at input terminal 5. Amplifier A-4 of envelope detector 26 takes an input signal from the output of amplifier stage 22 and feeds it through capacitor C-20 to a positive half cycle rectifier. The positive half cycle is passed on to storage capacitor C-21 by diode D-4, while the negative half cycle of the signal is shunted to ground via diode D-3. In this fashion, the charge on capacitor C-21 is proportional to the absolute magnitude of the signal received from amplifier stage 22. The voltage on capacitor C-21 is coupled via resistor R-41 to the gain control input terminal 5 of transconductance amplifier A-2. The operation of amplifier A-2 is such that the greater the current flowing into terminal 5, the greater the gain of the amplifier. Therefore, signals received by terminal 2 of amplifier A-2 will be amplified with a small gain if their signal strength is low, as detected by the envelope detector 26. However, if the signal strength of incoming signal is high, that signal will be amplified at an even greater gain than the low signal strength signal, and, in this sense, the amplitude of the output of stage 24 is expanded according to the amplitude of its input. The expander stage may or may not be necessary depending upon the effectiveness of the automatic frequency selecting means 36 and the rejectivity of the tuning circuit 12. The output of amplifier A-2 is coupled via coupling capacitor C-19 and resistor R-22 to the input of buffer amplifier A-3 of stage 28. The output of amplifier A-3 is, in turn, coupled via capacitor C-16, variable potentiometer R-33 and coupling capacitor C-17 to the base of driver transistor Q-11. The collector of transistor Q-11 in connected via a transformer TR-1 to a loudspeaker element LS. The gain of the final stage may be adjusted by changing the setting on potentiometer R-33 in a conventional manner. The system thus far described is one of a receiver adapted to receive a preselected frequency F-1. However, as the tourist passes from Loop 1 to Loop 2, the frequency F-2 will become stronger than frequency F-1 and it will be desirable for the receiver to adjust its tuning to that particular frequency. The automatic frequency selecting is done by stage 36 in a manner that will be described as follows.

The automatic frequency selecting means 36 receives one input from the filter stage 20 via resistor R-33 in a manner previously described. Amplifier A-5 is a comparitor which compares the amplitude of the signal input at terminal 13 with a fixed reference at terminal 12. The fixed reference voltage is established by voltage divider resistors R-42 and R-34. Obviously, this threshold may be changed by varying the values of those two resistors. Whenever the signal strength from the filter stage exceeds the reference threshold established by resistors R-42 and R-34, then comparitor A-5 produces an output which is fed into terminal 5 of amplifier A-6. Amplifier A-6 is in actuality an astable, free running multivibrator whose operation is controlled by the output of comparitor A-5. The oscillating frequency of the multivibrator is established by resistor R-35 and capacitor C-22. The output of astable multivibrator amplifier A-6 is fed into input terminal 7 of shift registers SR-1 and SR-2. The multivibrator amplifier circuit A-6 acts as a clock circuit which causes the shift registers to step from stage to stage in sequence until the clock is turned off. According to this preferred embodiment, shift register SR-1 is a four stage register and shift register SR-2 is a four stage register. The output terminals 12 and 13 of shift register SR-1 are shown connected respectively to the gates of FET Q-2 and FET Q-1. The output terminals 9 and 10 of SR-1 are not shown to be connected but it is to be understood that they would be connected to FET's Q-4 and Q-3 if those elements were shown in the drawing. Likewise, output terminal 9 and 10 of shift register SR-2 are connected respectively to the gates of FET's Q-7 and Q-8. In a similar manner, the outputs from terminals 12 and 13 would be connected to FET's Q-5 and Q-6 if those elements were shown in FIG. 1. Output terminals 9, 10, 12 and 13 of shift registers SR-1 and SR-2 correspond respectively to the output of each of the four stages of the shift register. In practice, shift registers SR-1 and SR-2 would be ring counters which continuously cycle as long as they receive a clock input from astable multivibrator amplifier A-6 and are loaded with 1 bit.

A delay circuit comprising transistor Q-12, resistors R-38, R-39, R-40 and capacitor C-23 serves to feed a first bit into the shift registers SR-1 and SR-2 via terminal 6. The bit is fed into terminal 6 immediately after the application of power. At the same time, capacitor C-23 charges up toward the threshold level of Q-12. Once C-23 reaches the threshold of Q-12, the output terminal 6 will drop to ground and the shift registers will start to search. A second delay circuit may be utilized with respect to SR-2 if so desired. According to this embodiment, either shift register SR-1 or SR-2 may be selected through the use of double-pole/double-throw switch S-3. However, it will be understood that, instead of using two four-stage shift registers, it would be just as possible to use one eight-stage shift register in a similar manner.

The delay or "battery up" circuit provides two functions. It gives the receiver enough time to come up to full voltage and it insures that there are clock pulses before the loading of a bit takes place. The transition time between "off" and "on" in this circuit may contain voltage variations due to different circuit charging rates. For example, if there is a 100ufd capacitor across the battery, typically it might take about 200 milliseconds to charge up to full voltage. Therefore, the delay circuit waits this period of time plus an additional 500 milliseconds which permits the clock to start sending out pulses before the counter circuit is loaded with a beginning bit.

The automatic frequency selecting means 36 can be used to automatically tune the receiver section to the strongest loop frequency received by the antenna. However, it is possible to override the function of the automatic frequency selecting means 36 by the manual select means S-1. Manual switch S-1 is connected so that it may selectively shunt any one of FET's Q-1 – Q-8 to ground. However, when the automatic frequency selecting means 36 is used, then switch S-1 must be turned to a full open position as shown in FIG. 1.

In typical operation, the receivers are stored upside-down so that mercury switch S-2 prevents any power drain on battery B. If a tourist is interested in taking the guided tour, he will rent the receiver for a nominal fee from a custodian at the tour site. The tourist is then directed to turn the receiver rightside-up and proceed past the displays on a preset course. Located adjacent to each of the displays is a loop antenna which broadcasts at one of the preselected frequencies F-1 through F-8 respectively. With the receiver chassis turned rightside-up the mercury switch S-2 makes contact and power is applied to the circuit. When power is applied to the circuit, the capacitor C-23 starts to charge up towards the voltage established by voltage divider R-39 and R-40. After a short period of time, an output pulse is fed into terminal 6 of shift register SR-1 when switch S-3 is in the position shown. Presuming that the tourist has not yet reached the display, the signal received by the receiver will be too low to stop the clock circuit which comprises the astable multivibrator amplifier A-6. Therefore, shift register SR-1 will continue to sequentially pass the bit introduced into terminal 6 through its stages in a ring counter fashion until the clock circuit turns off. As the shift register steps through its stages, it sequentially inserts capacitors CT-1 through CT-4 into parallel with the inductances L-1 and L-2. Therefore, each time the bit steps through the stages of the register, it will tune the stage 12 to a different frequency. Once the tourist reaches the vicinity of Loop 1, the signal strength of the frequency F-1 associated therewith increases. All during this time, the automatic frequency selecting means 36 is searching for a signal with sufficient strength to cause the shift register to stop searching. If the frequency F-1 is of sufficient strength to exceed the threshold of comparator A-5, then the astable multivibrator A-6 will cease to produce an output. At that point, the shift register SR-1 remains in its last previous state and the transmitter is tuned to frequency F-1 until such time as the signal strength from S-1 falls below the threshold established in comparitor A-5. According to FIG. 1, the first stage of shift register SR-1 is connected to output terminal 13. Output terminal 13 is connected to the gate of FET Q-1. With FET Q-1 turned on, capacitor CT-1 and capacitor A' form a resonant tank circuit with the ferrite core antennae L-1 and L-2. Only one of the FET's Q-1 – Q-4 can be turned on at any one time since only one bit can be stored in the shift register SR-1. Therefore, as long as the signal strength of the signal F-1 is sufficiently strong enough to surpass the threshold established in level comparator A-5, then the automatic frequency selecting means will continue to hold the receiver to frequency F-1. However, as the tourist passes from Loop 1 to Loop 2, the strength of signal F-1 will fall below the threshold established in comparator A-5 and the clock multivibrator amplifier A-6 will begin to oscillate again. At this point, the oscillations are passed on to shift register SR-1 and the automatic frequency selecting means 36 begins to search for another sufficiently strong frequency. As the tourist enters the proximity of Loop 2, the strength of the signal F-2 received will exceed the threshold established in level detector A-5 and, therefore, cause the clock circuit A-6 to stop. This, in turn, ceases the operation of shift register SR-1 with terminal 12 being high. With terminal 12 high, FET Q-2 will complete a tank circuit with capacitor CT-2 and capacitor A' along with the aforementioned inductances L-1 and L-2. As long as the tourist stays in the proximity of Loop 2, the receiver system will automatically stay tuned to frequency F-2. However, as the tourist moves from Loop 2 to the proximity of Loop 3 the automatic frequency selecting means will search for frequency F-3 in the manner previously described with reference to frequencies F-1 and F-2. Therefore, whenever the receiver is in an area where the signal strength of the preselected frequency is below the threshold value of the level detector amplifier A-5, then the automatic frequency selecting means will stay in the select mode. However, whenever the receiver comes into proximity with a loop wherein the preselected frequency F produces a filtered signal greater than the threshold value of the level detector A-5, then the receiver will tune itself to that frequency. If the situation ever arises where two or more frequencies produce a filtered output whose amplitude exceeds the thresholds of level detector A-5, then the automatic frequency selecting means will latch onto the first frequency it samples with an amplitude above the threshold value of the level detector. However, in a well designed system, this situation is relatively rare, since the preselected frequency of any particular loop is bound to be above the threshold of the level detector and any frequency associated with any other loop is bound to be below the level of the level detector threshold.

According to the preferred embodiment, shift register S-1 may search for a frequency between 136 and 260 kilo Hertz and shift register SR-2 may be designed to search for a frequency between 52 and 115 kilo Hertz. The clock circuit would typically have an oscillating rate of about 5 Hertz and the receiver would have a dwell time of approximately one-quarter of that or one-twentieth of a second. It is necessary that the dwell time of the receiver be long enough so that an adequate sample of the signal amplitude at any one of the preselected frequencies may be determined. The foregoing frequency and dwell time perameters are provided for the purposes of illustration only, and it would be well understood by those of ordinary skill in the art that a wide variety of frequency and time perameters would also be suitable.

It will be obvious to those of ordinary skill in the art that certain changes may be made to the invention without departing from the scope thereof. While the invention is disclosed as being advantageous in the context of a simple and efficient linear system, it will be appreciated that such a system could be used in the context of an FM or superhetrodyne receiver. Additionally, while an expander circuit is shown in the context of the linear receiver system, such a circuit is not absolutely necessary where noise and cross talk is a less critical aspect of the system.

While the invention has been particularly shown and described with reference to the preferred embodiment thereof, it will be understood by those skilled in the art that various changes in form and detail may be made therein without departing from the spirit and scope of the invention.

I claim:

1. An improved portable radio receiver for receiving a plurality of preselected frequencies, said receiver comprising:

an antenna for receiving said pre-selected frequencies;

a tuning means comprising a tank-type resonant circuit including at least one inductance and at least a plurality of capacitance elements connected therewith, said tuning means being connected to said antenna;

a detecting means for detecting signals from said tuning means; and, an audio transducer stage for producing an audio output in response to the output of said detecting means; and, an automatic frequency selecting means for scanning said pre-selected frequencies and for automatically tuning said receiver to the first one of said pre-selected frequencies whose signal strength exceeds a predetermined amplitude, said automatic frequency selecting means including:

a level detector for providing a specified output whenever the amplitude of the signal received from the detecting means exceeds a predetermined threshold;

an oscillator having an input connected to the output of said level detector;

a counter circuit comprising a shift register having a plurality of outputs, each output corresponding to a stage of said shift register, said counter circuit having an input connected to the output of said oscillator;

a switching means comprising a plurality of switch means each having an input connected to one of said outputs of said counter circuit, said switching means comprising a plurality of field effect transistors, each of which is connected to one of said capacitive elements of said tank circuit, said switching means being connected in circuit with said tuning means; and, a delay means for loading a beginning bit into said shift register after said receiver has been turned on.

2. The system of claim 1 wherein the system further includes:

a switch means for activating said shift registers.

3. The system of claim 1 wherein said detecting means further comprises:

a high impedance amplifier having a high resistance input connected to the output of said tuning means; and a high gain feed-back type amplifier having an input connected to the output of said high impedance amplifier.

4. The system of claim 3 wherein said detecting means further comprises:

a half wave rectifier having an input connected to the output of said high gain feed-back type amplifier; and a filter network having an input connected to the output of said half wave rectifier, wherein the output of said filter network serves as the input to said automatic frequency selecting means.

5. The system of claim 4 wherein the system further includes:

an expander means connected in circuit between said detecting means and said audio transducer.

6. The system of claim 1 wherein said expander means comprises:

a variable gain amplifier having a signal input terminal connected to said detecting means and having an output connected to said audio transducer, said variable gain amplifier further including a gain control input terminal; and, an envelope detecting circuit having an input terminal connected to the signal input terminal of said variable gain amplifier and having an output connected to the gain control input terminal of said variable gain amplifier.

7. The system of claim 6 wherein said system further includes:

an amplifier stage connected in circuit between said filter network and said variable gain amplifier.

8. The system of claim 7 wherein said system further includes:

a buffer amplifier connected between the output of said variable gain amplifier and the input of said audio transducer.

9. The system of claim 8 wherein said shift register comprises a ring counter.

* * * * *